(12) United States Patent
Weir

(10) Patent No.: US 9,110,095 B1
(45) Date of Patent: Aug. 18, 2015

(54) ELECTRIC TESTING TOOL FOR RAILROAD RELAYS

(76) Inventor: Roy E. Weir, Milford, MA (US)

( * ) Notice: Subject to any disclaimer, the term of this patent is extended or adjusted under 35 U.S.C. 154(b) by 446 days.

(21) Appl. No.: 13/545,062

(22) Filed: Jul. 10, 2012

(51) Int. Cl.
*G01R 1/04* (2006.01)

(52) U.S. Cl.
CPC ........................................ *G01R 1/04* (2013.01)

(58) Field of Classification Search
CPC ...... G01R 19/14; G01R 1/06711; G01R 1/04; B64D 15/12
USPC ......... 324/133, 556, 72.5; 439/13, 17–20, 23, 439/882, 482
See application file for complete search history.

(56) References Cited

U.S. PATENT DOCUMENTS

| 1,816,846 | A | | 8/1931 | Harvey |
| 2,714,196 | A | | 7/1955 | Melehan |
| 3,425,271 | A | | 2/1969 | Hendry |
| 5,512,840 | A | * | 4/1996 | Nogaki ..................... 324/754.02 |
| 6,433,530 | B1 | * | 8/2002 | Pool .............................. 324/72.5 |
| 6,848,139 | B2 | | 2/2005 | Simon et al. |
| 2006/0006602 | A1 | * | 1/2006 | Roddis ........................... 277/378 |
| 2008/0191096 | A1 | * | 8/2008 | Fahrner et al. ............. 244/134 D |
| 2011/0146834 | A1 | * | 6/2011 | McDonald et al. ........... 140/123 |

\* cited by examiner

*Primary Examiner* — Arleen M Vazquez
*Assistant Examiner* — Brent J Andrews
(74) *Attorney, Agent, or Firm* — Robert C. Montgomery; Montgomery Patent and Design, LP.

(57) ABSTRACT

A tool for use in the testing of railroad relays allows for the uninterrupted completion of an electric circuit while performing a mechanical operation. The device provides an electrical connection point at a midpoint of a driver shaft. The connection point is used to connect a voltmeter or similar measuring instrument lead. The connection point utilizes a copper brush mechanism to keep constant electrical contact with the shaft even when turning. The connection point is held in place by a pair of retaining washers. These features allow a user to perform electrical readings through the driver while using the driver to perform mechanical adjustments.

6 Claims, 3 Drawing Sheets

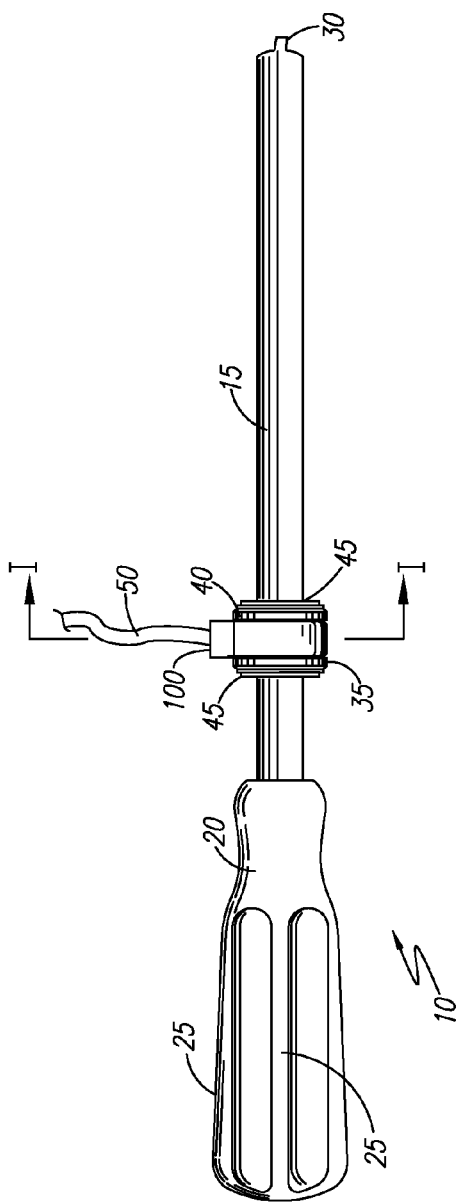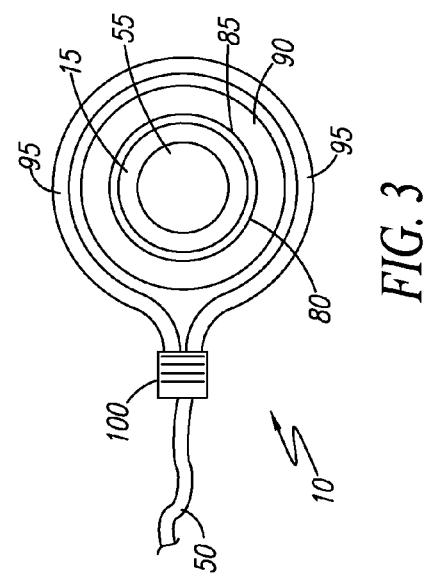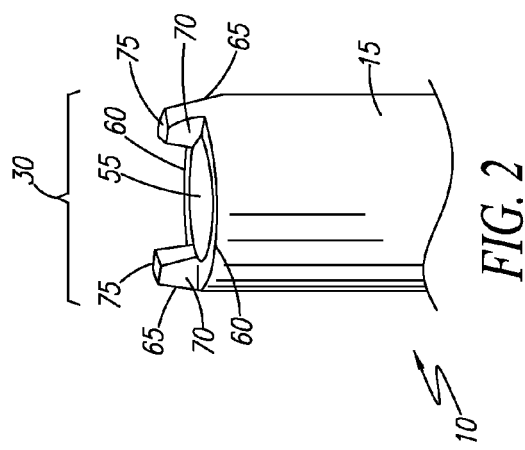

ELECTRIC TESTING TOOL FOR RAILROAD RELAYS

RELATED APPLICATIONS

Not Applicable.

FIELD OF THE INVENTION

The present invention relates generally to circuit continuity testing devices, and in particular, to the combination tool for testing circuit continuity and performing mechanical adjustments.

BACKGROUND OF THE INVENTION

As anyone who performs a lot of mechanical work will attest, nothing beats having the proper tool for a job. The proper tool can save time and money, produces a higher quality job, reduces damage to equipment, and provides for the increased safety of the worker. Each field of mechanical work has its own type of specialty tools, each performing a specialized task. One (1) such task performed by technicians working on railroad signaling or control equipment is that of relay maintenance. Such maintenance often requires the technician to tighten or loosen "e-nuts" while maintaining electrical continuity with the circuit. These "e-nuts" are typically gate mechanisms with adjustable buffers, which are used to move and adjust a position of electrical armatures of coil assemblies. Often times, field adjustments of these connections are necessary and workers often hook electrical leads to the shaft of the adjusting tool such that continuity is maintained during adjustment. However, as the tool is turned, the electrical lead is prone to falling off, causing reading error or perhaps even delays in train operations.

Various attempts have been made to provide current testing devices for use with mechanical adjustment tools that do not break the continuity of the circuit. Examples of these attempts can be seen by reference to several U.S. patents. U.S. Pat. No. 5,512,840, issued in the name of Nogaki, describes electrical test clips for slotted and Phillips screw heads. This patent discloses an electrical test clip that is temporarily attachable to a screw head.

U.S. Pat. No. 6,433,530, issued in the name of Pool, describes a hand held circuit and polarity tester. This patent discloses an electric circuit tester with interchangeable attachments for interacting with a variety of leads and contacts.

U.S. Pat. No. 6,848,139, issued in the name of Simon, describes a combination hand tool and electrical testing device. This patent discloses a device that is a combination of a tool such as wire strippers and an electric circuit testing instrument such as a continuity tester or a voltage detector.

While these devices may fulfill their respective, particular objectives, each of these references suffer from one (1) or more disadvantages. Particularly, none of the prior art devices are suitable for engaging an "e-nut" while maintaining continuity in a circuit.

SUMMARY OF THE INVENTION

The inventor has recognized the aforementioned inherent problems and lack in the art and observed that there is a need for a current testing tool that can be used to loosen or tighten an "e-nut" without breaking the continuity of a circuit for railroad relay maintenance and other similar purposes without the disadvantages as described above. The development of the present invention substantially departs from the conventional solutions and in doing so fulfills this need.

In order to address this recognized need, an object of the present invention is to provide a railroad current testing tool that can be connecting to a conventional voltmeter or similar instrument lead and allows for uninterrupted completion of an electric circuit while engaging and adjusting an "e-nut."

To achieve the stated objectives, the present invention incorporates various features. Features of the present invention include an insulated handle, an electrically conductive shaft having a first end affixed to the handle and a second end opposite the first end. The second end is adapted to engage an "e-nut" connector of a railroad control relay circuit. The shaft includes a hollow interior extending from the first end to the second end.

An electrical continuity assembly is also rotatably connected to an exterior of the shaft configured for electrical connection to an electrical test instrument.

Other features of certain embodiments of the present invention include the shaft second end having a fitting configured for mechanical connection and electrical connection to the "e-nut". The fitting includes a circular opening defined by the hollow interior of the shaft second end, a flat face defining a perimeter of the circular opening, and a pair of protrusions extending outwardly from opposing edges of the flat face.

Other features of certain embodiments of the present invention also include the electrical continuity assembly having a rotational bearing with a stationary inner race in mechanical and electrical contact with the shaft and a rotating outer race in electrical contact with the inner race. A conductive copper strap is in mechanical and electrical contact with an exterior of the outer race. A retaining mechanism is coupled to ends of the copper strap for securing the copper strap around the outer race. An electrical lead is electrically connected to the copper strap and extends outwardly from the retaining mechanism for electrical communication with the electrical test instrument.

Another object of the present invention is to provide a method of utilizing the tool that may be achieved by performing a series of steps, including, but not limited to: Procuring the tool. Engaging the positive lead portion of the electrical continuity assembly with a test instrument. Engaging a negative connection of the test instrument with a railroad control relay circuit. Applying the specialty fitting to the "e-nut" and tightening or loosening the "e-nut" in a conventional manner. Ensuring an accurate measurement of the circuit parameter while still maintaining circuit continuity of the relay circuit.

Furthermore, the described features and advantages of the disclosure may be combined in various manners and embodiments as one skilled in the relevant art will recognize. The disclosure can be practiced without one (1) or more of the features and advantages described in a particular embodiment.

Further advantages of the present disclosure will become apparent from a consideration of the drawings and ensuing description.

BRIEF DESCRIPTION OF THE DRAWINGS

The advantages and features of the present disclosure will become better understood with reference to the following more detailed description and claims taken in conjunction with the accompanying drawings, in which like elements are identified with like symbols, and in which:

FIG. 1 is a side view of an electric testing tool for railroad relays, in accordance with the present invention;

FIG. 2 is a detailed view of a specialty fitting provided as part of the electric testing tool for railroad relays, in accordance with present invention;

FIG. 3 is a sectional view of the electric testing tool for railroad relays taken along line I-I of FIG. 1;

Figure 4:
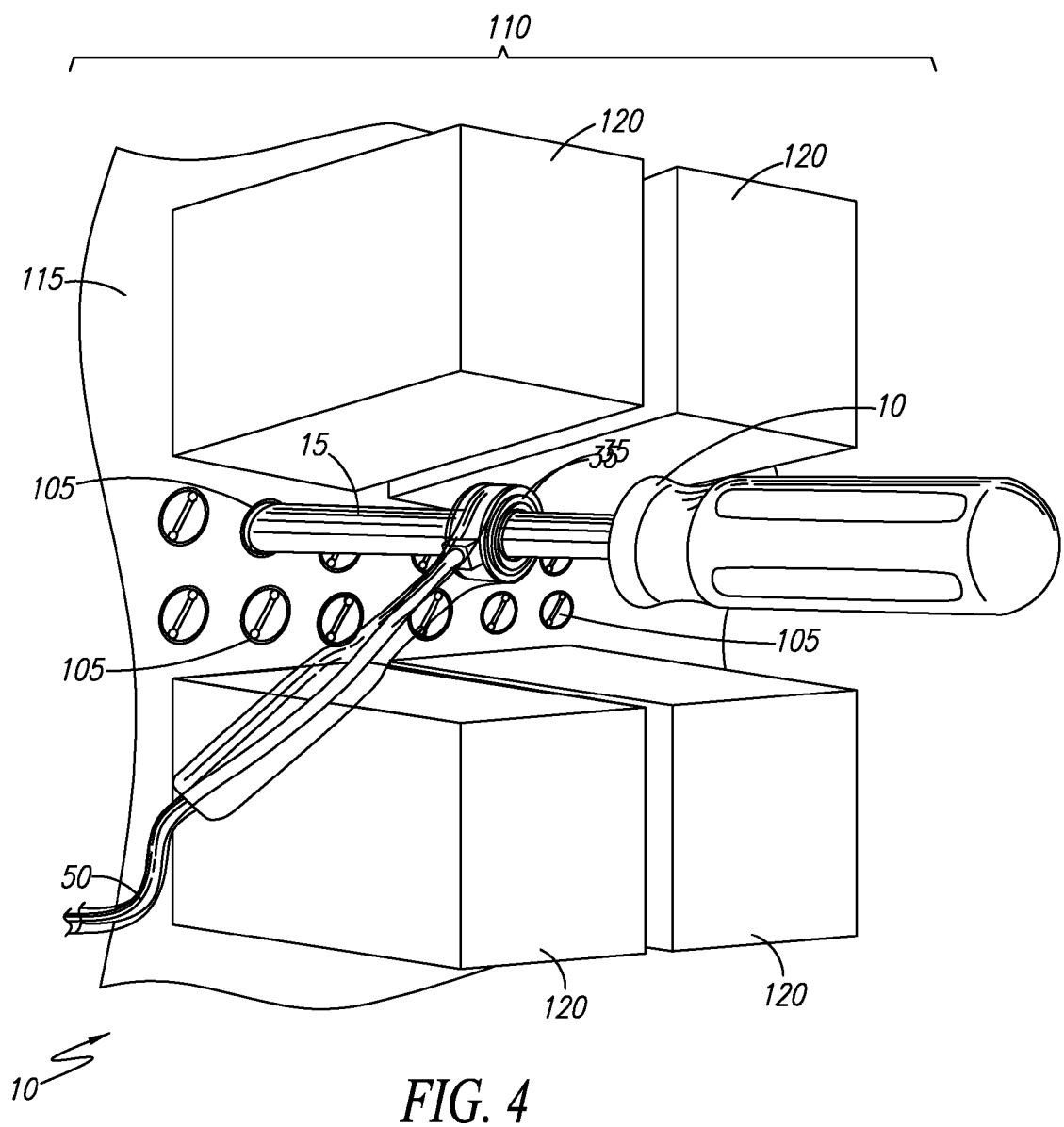
FIG. 4 is an isometric view of the electric testing tool for railroad relays shown in an utilized state; and, FIG. 5 is an electrical schematic diagram of a circuit utilizing the electric testing tool for railroad relays, in accordance with the present invention.

DESCRIPTIVE KEY 10 electric testing tool for railroad relays
15 hollow shaft
20 insulated ergonomic handle
25 non slip surface
30 specialty fitting
35 electrical continuity assembly
40 bearing assembly
45 rubber retaining washer
50 positive lead
55 circular opening
60 flat face
65 protrusions
70 parallel flat faces
75 flat upper face
80 rotational electrically conductive bearing
85 inner race
90 outer race
95 conductive copper strap
100 retaining mechanism
105 "e-nut"
110 railroad control relay circuit
115 base surface
120 relays
125 power source
130 negative connection
135 test instrument

DETAILED DESCRIPTION OF THE PREFERRED EMBODIMENT

In accordance with the invention, the best mode is presented in terms of a preferred embodiment, herein depicted within FIGS. 1 through 5. However, the disclosure is not limited to the described embodiments and a person skilled in the art will appreciate that many other embodiments are possible without deviating from the basic concept of the disclosure and that any such work around will also fall under its scope. It is envisioned that other styles and configurations can be easily incorporated into the teachings of the present disclosure, and only one particular configuration may be shown and described for purposes of clarity and disclosure and not by way of limitation of scope.

It can be appreciated that, although such terms as first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one (1) or more stated elements, steps or functions without precluding one or more unstated elements, steps or functions. Relative terms such as "front" or "rear" or "left" or "right" or "top" or "bottom" or "below" or "above" or "upper" or "lower" or "horizontal" or "vertical" may be used herein to describe a relationship of one (1) element, feature or region to another element, feature or region as illustrated in the figures. It should be understood that these terms are intended to encompass different orientations of the device in addition to the orientation depicted in the figures. It should also be understood that when an element is referred to as being "connected" to another element, it can be directly connected to the other element or intervening elements may be present. In contrast, when an element is referred to as being "directly connected" to another element, there are no intervening elements present. It should also be understood that the sizes and relative orientations of the illustrated elements are not shown to scale, and in some instances they have been exaggerated for purposes of explanation.

Referring now to FIGS. 1 through 5, depicting an electric testing tool for railroad relays, identified generally by reference to a tool 10, where like reference numerals represent similar or like parts. In accordance with the teaching of the present disclosure, the tool 10 provides for a railroad current testing device that can be connecting to a conventional voltmeter or similar instrument lead and allows for uninterrupted completion of an electric circuit while engaging and adjusting an "e-nut."

Referring to FIG. 1, the tool 10 is generally provided with a hollow shaft 15 that terminates in an insulated ergonomic handle 20 in much the same manner as a conventional screwdriver or nut driver. The insulated ergonomic handle 20 is of an ergonomic and comfortable design and is provided with a non slip surface 25 such as knurling or fluted edges to aid in control and reduced slippage when used with gloves or hands that are sweating. The hollow shaft 15 terminates in a specialty fitting 30 designed to engage "e-nuts" used on railroad signaling and control circuits. Further description of the specialty fitting 30 will be provided herein below.

Located approximately midway along the hollow shaft 15 is a electrical continuity assembly 35 which allows the hollow shaft 15 to serve as a test probe in an electrical test circuit as well as providing physical contact to move and adjust the "e-nuts". The electrical continuity assembly 35 consists of a bearing assembly 40 that allows continuous electrical conductivity with low or no resistance while allowing rotation in a three hundred sixty degree)(360° field of movement. The bearing assembly 40 is held in place with two (2) rubber retaining washers 45 on either side of the bearing assembly 40. The electrical continuity assembly 35 also provides a flexible positive lead 50 which allows electrical connection of the hollow shaft 15 to a test instrument 135 such as a voltmeter, indicator light, current meter, or similar piece of testing equipment.

The tool 10 is preferably constructed using well known metal forming and plastic forming technologies. Specialized machining to produce the specialty fitting 30 to the necessary tolerances would also be necessary. The bearing assembly 40 may require pressing onto the hollow shaft 15 using hydraulic assistance.

As best seen in FIG. 2, the specialty fitting 30 is provided with a circular opening 55 that follows the centerline axis of the hollow shaft 15. The specialty fitting 30 provides a flat face 60 which engages the face of the "e-nut" and provides the maximum surface area to provide electrical contact and thus reduced electrical resistance to the testing circuit. Such a circuit will be described in greater detail herein below. The specialty fitting 30 is provided with two (2) protrusions 65 which engage the slots on the "e-nut" and allow for turning of the "e-nut".

The protrusions 65 are provided with parallel flat faces 70 and a flat upper face 75 for providing maximum electrical contact for the purposes described above. The protrusions 65 are located at opposing one hundred eighty degree)(180° positions upon the flat face 60. The outer surface of the flat face 60, the protrusions 65, the parallel flat faces 70 of the protrusions 65, and the flat upper faces 75 of the protrusions 65 could be plated with a conductive material such as brass or copper to further aid in reducing resistance between the specialty fitting 30 and the electrical "e-nut" under testing or adjusting conditions. It should be noted that the specific configuration as depicted in FIG. 2 allows for adaptation to specific "e-nuts". Other configurations would work with equal effectiveness depending on specific needs and as such, should not be interpreted as a limiting factor of the present disclosure.

Referring to FIG. 3, which more clearly depicts the circular opening 55 at the center of the hollow shaft 15. A rotatable, electrically conductive bearing 80 is provided around the hollow shaft 15 such that an inner race 85 is in physical and electrical contact with the hollow shaft 15. An outer race 90 is bordered by a conductive copper strap 95 which is held in place by a retaining mechanism 100. The retaining mechanism 100 can be adjusted to provide a constant physical force between the outer race 90 and the conductive copper strap 95. Such re-adjustment may be necessary over time due to stretching of the conductive copper strap 95, cleaning of the tool 10, or for general maintenance.

The retaining mechanism 100 terminates in the positive lead 50 where it is connectable to testing devices, as will be described herein below. It is envisioned that the inner race 85 and the outer race 90 would be manufactured from electrically conductive material such as steel or brass. The hollow shaft 15 would be constructed of heat treated steel for physical strength. The exterior of the hollow shaft 15 could be provided with a protective finish such as plating to prevent corrosion.

Figure 5:
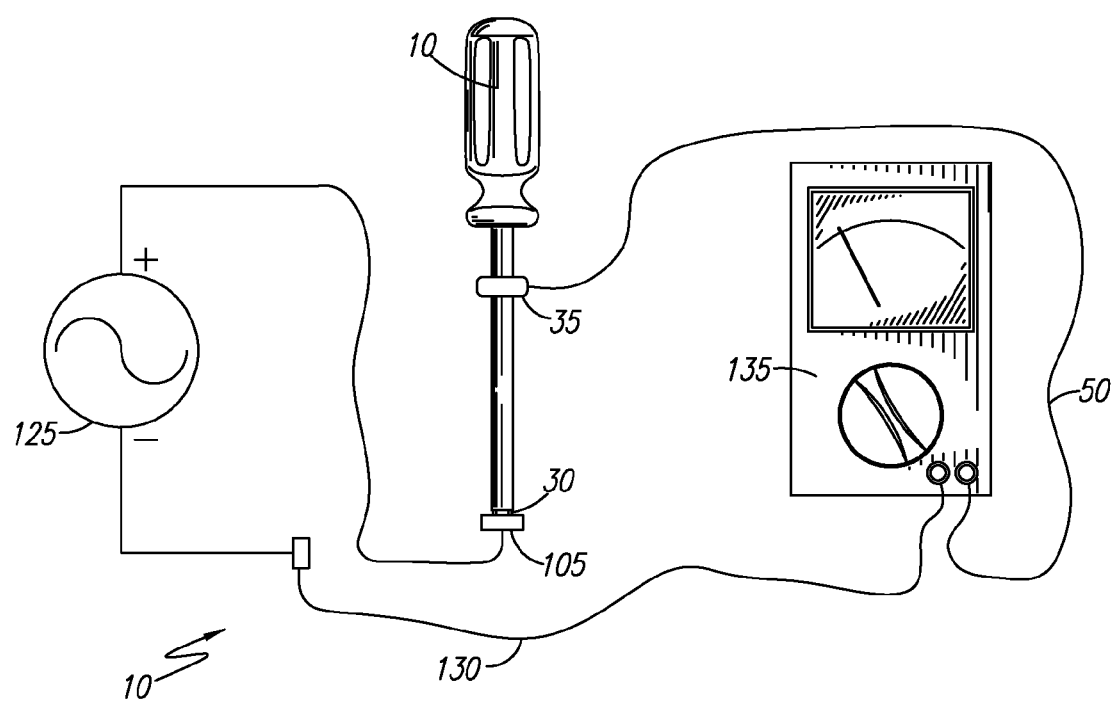

Referring now to FIGS. 4 and 5, this figure illustrates the tool 10 engaged upon a single "e-nut" 105 provided as part of railroad control relay circuit 110 having a plurality of "e-nuts". The "e-nut" 105 is provided upon a base surface 115 such as a base plate or terminal strip provided in the railroad control relay circuit 110. The railroad control relay circuit 110 uses a variety of relays 120 that are generally tall in nature compared with the hollow shaft 15. This configuration makes apparent the need for the long shaft of the hollow shaft 15 where it can easily engage the "e-nut" 105 for purposes of adjustment as well as testing. The electrical continuity assembly 35 provides for connection of the positive lead 50 to an electrical test instrument 135 (see FIG. 5). Such a configuration provides the user the ability to hold the tool 10 in a manner similar to that of a screwdriver to both adjust the "e-nut" 105 and test for electrical continuity of the circuit by physical (mechanical) adjustment of the "e-nut" 105 and electrical connection functioning as a test probe for electrical measurements.

A power source 125 such as a voltage source or a current source is provided as part of the railroad control circuit. Such control circuits include track signaling, train control, auxiliary controls, or the like. The use of the tool 10 with a specific type of railroad control circuit is not intended to be a limiting factor of the present disclosure. A negative connection 130 from a test instrument 135 such as a voltmeter, ammeter, load, signal light, or the like is made to the power source 125. The positive lead 50 from the test instrument 135 is routed to and is in electrical communication with the electrical continuity assembly 35 of the tool 10. To complete the electrical circuit, the specialty fitting 30 on the tool 10 is connected to a particular "e-nut" 105 as provided as part of a railroad control relay circuit 110. The "e-nut" 105 is electrically connected to the positive output of the power source 125 during normal operation of the power source 125 and such, completes the circuit and allows for electrical measurements of the railroad control relay circuit 110.

It can be appreciated by one skilled in the art that other styles and configurations of the present invention can be easily incorporated into the teachings of the present disclosure and only certain particular configurations have been shown and described for purposes of clarity and disclosure and not by way of limitation of scope.

In accordance with the principles of the present invention, the device can be utilized by the user in a simple and effortless manner with little or no training in general accordance with FIG. 1 through FIG. 5. It can be appreciated that the steps required to utilize the tool 10, as described, can performed in alternative order and as such should not be viewed as a limiting factor.

The use of the tool 10 would commence by engaging the positive lead portion 50 of the electrical continuity assembly 35 with a test instrument 135. The negative connection 130 would be connected to the railroad control relay circuit 110 in a normal manner so as to allow measurement of an electrical parameter of the railroad control relay circuit 110 via the test instrument 135 in a conventional manner. At this point in time, the tool 10 is ready for utilization.

During utilization of the tool 10, the user would apply the specialty fitting 30 of the tool 10 to the "e-nut" 105 under test. This will produce an appropriate electrical readout on the test instrument 135. Next, the user can tighten or loosen the "e-nut" 105 by rotating the tool 10 clockwise or counter clockwise with the protrusions 65 engaged within slots provided upon the top surface of the "e-nut" 105. This action provides for continuous electrical connectivity with the "e-nut" 105 thus ensuring accurate measurement of the circuit parameter, while still allowing for the engaging and moving action of the inner race 85 as the tool 10 is rotated. Once the necessary movement has occurred, the tool 10 can be removed from the "e-nut" 105 thus returning the railroad control relay circuit 110 to normal operation. Continuous usage of the tool 10 may then continue by selection of the appropriate test points and the physical placement of the tool 10 on another "e-nut" 105 as needed. Such action prevents control error and train delays during the tightening and loosening action of the "e-nut" 105 and allows for quick connection of electrical test equipment.

The foregoing descriptions of specific embodiments have been presented for purposes of illustration and description. They are not intended to be exhaustive or to limit the invention and method of use to the precise forms disclosed. Various modifications and variations can be appreciated by one skilled in the art in light of the above teachings. The embodiments have been chosen and described in order to best explain the principles and practical application in accordance with the invention to enable those skilled in the art to best utilize the various embodiments with expected modifications as are suited to the particular use contemplated. It is understood that various omissions or substitutions of equivalents are contemplated as circumstance may suggest or render expedient, but is intended to cover the application or implementation without departing from the spirit or scope of the claims of the invention.

What is claimed is:

1. An electric testing tool for railroad relays comprising:
an insulated handle;
an electrically conductive shaft having a first end affixed to said handle and a second end opposite said first end and defining a hollow interior extending from said first end to said second end,
a fitting connected to said second end of said shaft, said fitting comprising:
 a circular opening defined by said hollow interior of said shaft at said second end;
 a flat face defining a perimeter contact surface of said circular opening and configured to electrically engage an e-nut connector of a railroad control relay circuit; and
 an opposed pair of protrusions extending perpendicularly outward from said face and configured to mechanically and electrically engage said e-nut; and,
an electrical continuity assembly rotatably connected to an exterior of said shaft such that said electrical continuity assembly remains rotationally stationary in response to rotation of said shaft relative to said electrical continuity assembly, said electrical continuity assembly comprising:
 a rotational bearing comprising a stationary electrically conductive inner race in mechanical and electrical contact with an exterior of said shaft and a rotating electrically conductive outer race in electrical contact with said inner race, said outer race being freely rotatable relative to said inner race;
 a conductive copper strap in mechanical and electrical contact with an exterior of said outer race;
 a retaining mechanism coupled to ends of said copper strap and configured to secure said copper strap around said outer race; and,
 an electrical lead comprising a first end mechanically and electrically connected to said copper strap by said retaining mechanism and an opposed second end configured to be mechanically and electrically connected to an electrical test instrument; and
a pair of insulating rubber washers coupled to said shaft on opposing sides of said rotational bearing to retain a linear position of said rotational bearing relative to said shaft.

2. The tool of claim 1, wherein said handle comprises a non-slip exterior surface.

3. The tool of claim 1, wherein each protrusion of said pair of protrusions comprises opposed flat side surfaces and a flat upper surface.

4. The tool of claim 1, wherein said fitting is formed of an electrically conductive material.

5. The tool of claim 1, wherein said electrical continuity assembly is disposed at a midpoint of said shaft.

6. The tool of claim 1, wherein said face and said pair of protrusions of said fitting are plated with an electrically conductive material.

* * * * *